United States Patent
Horng et al.

(10) Patent No.: US 8,736,326 B1
(45) Date of Patent: May 27, 2014

(54) FREQUENCY SYNTHESIZER AND FREQUENCY SYNTHESIS METHOD THEREOF

(71) Applicant: National Sun Yat-sen University, Kaohsiung (TW)

(72) Inventors: Tzyy-Sheng Horng, Kaohsiung (TW); Chung-Hung Chen, Kaohsiung (TW); Fu-Kang Wang, Kaohsiung (TW)

(73) Assignee: National Sun Yat-sen University, Kaohsiung (TW)

( * ) Notice: Subject to any disclaimer, the term of this patent is extended or adjusted under 35 U.S.C. 154(b) by 0 days.

(21) Appl. No.: 13/900,555

(22) Filed: May 23, 2013

(30) Foreign Application Priority Data

Feb. 8, 2013 (TW) ............................... 102105188 A

(51) Int. Cl.
*H03L 7/06* (2006.01)

(52) U.S. Cl.
USPC ........... 327/156; 327/105; 327/147; 327/158; 327/161; 375/371; 375/372; 375/373; 375/374; 375/375; 331/3; 331/25; 331/30; 455/260; 455/261; 455/262; 455/264; 455/265

(58) Field of Classification Search
USPC .......... 327/105, 147, 156, 158, 161; 375/371, 375/372, 373, 374, 375, 376; 331/2, 25, 30; 455/260, 261, 262, 263, 264, 265
See application file for complete search history.

(56) References Cited

U.S. PATENT DOCUMENTS

| | | | |
|---|---|---|---|
| 5,343,168 A | 8/1994 | Guthrie | |
| 5,579,184 A * | 11/1996 | Nakanishi et al. | ............... 360/51 |
| 5,717,730 A | 2/1998 | Prakash et al. | |
| 7,084,709 B1 * | 8/2006 | Leong et al. | ..................... 331/11 |
| 7,391,839 B2 * | 6/2008 | Thompson | .................... 375/376 |
| 7,449,960 B2 * | 11/2008 | Bunch et al. | .................. 331/1 A |
| 8,040,194 B2 | 10/2011 | Gamliel | |
| 8,248,172 B2 | 8/2012 | Okada et al. | |
| 2007/0066262 A1 | 3/2007 | Mishra | |
| 2007/0105518 A1 | 5/2007 | Chang et al. | |
| 2007/0159259 A1 | 7/2007 | Suh et al. | |
| 2008/0024231 A1 | 1/2008 | Chang et al. | |
| 2008/0233914 A1 | 9/2008 | Chen et al. | |
| 2009/0028217 A1 | 1/2009 | Wang et al. | |
| 2010/0233979 A1 | 9/2010 | Bagheri et al. | |
| 2011/0285435 A1 | 11/2011 | Okabe | |
| 2012/0262239 A1 | 10/2012 | Taghivand et al. | |

FOREIGN PATENT DOCUMENTS

EP 0664618 7/1995

* cited by examiner

*Primary Examiner* — John Poos
(74) *Attorney, Agent, or Firm* — Jianq Chyun IP Office

(57) ABSTRACT

A frequency synthesizer and a frequency synthesis method thereof are provided. The frequency synthesizer includes a phase-locked loop unit, a voltage-controlled oscillating unit, and a frequency mixing unit. The phase-locked loop unit receives a reference signal and a feedback injection signal and generates a first oscillating signal according to the reference signal and the feedback injection signal. The voltage-controlled oscillating unit receives the feedback injection signal and generates a second oscillating signal according to the feedback injection signal. The frequency mixing unit is coupled to the phase-locked loop unit and the voltage-controlled oscillating unit, receives the first oscillating signal and the second oscillating signal, and mixes the first oscillating signal and the second oscillating signal to generate the feedback injection signal and an output signal.

9 Claims, 2 Drawing Sheets

FREQUENCY SYNTHESIZER AND FREQUENCY SYNTHESIS METHOD THEREOF

CROSS-REFERENCE TO RELATED APPLICATION

This application claims the priority benefit of Taiwan application serial no. 102105188, filed on Feb. 8, 2013. The entirety of the above-mentioned patent application is hereby incorporated by reference herein and made a part of this specification.

BACKGROUND OF THE INVENTION

1. Field of the Invention

The present invention generally relates to a frequency synthesizer, and more particularly, to a wideband frequency synthesizer with a feedback injection locking mechanism.

2. Description of Related Art

Wireless communication products and techniques, such as mobile phones, wireless local area networks (WLAN), Bluetooth, ultra wide bands (UWB), industrial scientific and medical (ISM) radio bands, and worldwide interoperability for microwave access (WiMAX) have been widely used in our daily life along with the development of wireless technologies in recent years. Thus, frequency synthesizers have been developed and applied to meet the requirements of local oscillating signals and communication channel selection in wireless communication systems.

To be specific, a frequency synthesizer provides a local oscillating signal to a radio frequency transceiver for the purpose of the frequency up/down conversion and linear modulation. Accordingly, the quality of the local oscillating signal is a major factor in signal transmission performance. The spectrum purity of the local oscillating signal affects not only the accuracy of the transmitted data but also the quality of the system channel. Particularly, in a multi-carrier system (for example, an orthogonal frequency division modulation (OFDM) communication system), high-density orthogonal carriers require high spectrum purity of the local oscillating source. In a wireless and frequently-used application, a frequency synthesizer has to be able to generate a pure and stable local oscillating signal in order to be integrated with a wireless transceiver.

Additionally, with the fast spreading of applications of communication technologies, large quantities of data are desired to be transmitted quickly. As a result, a wide transmission frequency bandwidth is desired to increase the bit transmission rate. Because a conventional frequency synthesizer has only one voltage-controlled oscillator, the frequency synthesizer usually has a narrow operating bandwidth therefore cannot meet the requirement of an existing multi-standard communication system for operating bandwidth. Thus, many wideband frequency synthesizers have been developed and discussed in recent years. In such a conventional wideband frequency synthesizer, multiple phase-locked loop circuits or multiple frequency dividers are adopted along with a multiplexer to make the output frequency to fall on different operating frequency band. In addition, a combination of different frequency synthesizers also allows the output frequency to fall on different operating frequency band therefore can meet the requirement of a broadband application.

However, the conventional techniques usually require very complicated hardware circuit designs and a long time for locking the frequency. In other words, a conventional wideband frequency synthesizer usually comes with a large circuit structure, a high power consumption level, and accordingly a high manufacturing cost. The frequency synthesizer integrated circuit in an existing communication system should offer a high efficiency and a low cost. Thereby, how to design a frequency synthesizer which is ideal and satisfactory has become a major subject in the industry.

SUMMARY OF THE INVENTION

Accordingly, the present invention is directed to a frequency synthesizer and a frequency synthesis method thereof, in which the operating bandwidth of a frequency synthesizer is greatly broadened by using a simple circuit design.

The present invention provides a frequency synthesizer. The frequency synthesizer includes a phase-locked loop unit, a voltage-controlled oscillating unit, and a frequency mixing unit. The phase-locked loop unit receives a reference signal and a feedback injection signal and generates a first oscillating signal according to the reference signal and the feedback injection signal. The voltage-controlled oscillating unit receives the feedback injection signal and generates a second oscillating signal according to the feedback injection signal. The frequency mixing unit is coupled to the phase-locked loop unit and the voltage-controlled oscillating unit, receives the first oscillating signal and the second oscillating signal, and mixes the first oscillating signal and the second oscillating signal to generate the feedback injection signal and an output signal.

According to an embodiment of the present invention, the feedback injection signal is a differential frequency signal generated by the frequency mixing unit according to the first oscillating signal and the second oscillating signal.

According to an embodiment of the present invention, the phase-locked loop unit includes a frequency divider, a phase frequency detector, a charge pump, a loop filter, and a first voltage-controlled oscillator. The frequency divider is coupled to the frequency mixing unit. The frequency divider receives the feedback injection signal and performs frequency-division to the feedback injection signal to generate a frequency-division signal. The phase frequency detector is coupled to the frequency divider. The phase frequency detector receives the reference signal and the frequency-division signal and generates a phase difference signal according to the reference signal and the frequency-division signal. The charge pump is coupled to the phase frequency detector. The charge pump receives the phase difference signal and generates a charging signal according to the phase difference signal. The loop filter is coupled to the charge pump. The loop filter receives the charging signal and generates a control signal according to the charging signal. The first voltage-controlled oscillator is coupled to the loop filter. The first voltage-controlled oscillator receives the control signal and generates the first oscillating signal according to the control signal.

According to an embodiment of the present invention, the frequency divider is an integer or fractional type divider.

According to an embodiment of the present invention, the voltage-controlled oscillating unit includes a frequency multiplier and a second voltage-controlled oscillator. The frequency multiplier is coupled to the frequency mixing unit. The frequency multiplier receives the injection frequency signal and performs frequency-multiplication to the injection signal to generate a frequency-multiplication signal for second voltage-controlled oscillator. The second voltage-controlled oscillator is coupled to the frequency multiplier. The second voltage-controlled oscillator receives the frequency-multiplication signal and generates the second oscillating signal according to the frequency-multiplication signal.

According to an embodiment of the present invention, the frequency multiplier is an integer frequency multiplier for effective injection-lock phenomenon at second oscillator. However, the multiplier is not limited in the present invention and can be determined according to the actual application requirement even as an omission to simplify.

According to an embodiment of the present invention, the frequency mixing unit includes a frequency mixer and a mixer filter. The frequency mixer is coupled to the phase-locked loop unit and the voltage-controlled oscillating unit. The frequency mixer receives the first oscillating signal and the second oscillating signal and mixes the first oscillating signal and the second oscillating signal to generate a mixed-frequency signal and the output signal. The mixer filter is coupled to the frequency mixer. The mixer filter receives the mixed-frequency signal and generates the feedback injection signal according to the mixed-frequency signal.

According to an embodiment of the present invention, the frequency synthesizer further includes an output filter. The output filter is coupled to the frequency mixer. The output filter receives the output signal and low-pass or high-pass filters the output signal.

The present invention provides a frequency synthesis method of a frequency synthesizer. The frequency synthesis method includes following steps. A phase-locked loop unit is provided, where the phase-locked loop unit generates a first oscillating signal according to a reference signal and a feedback injection signal. A voltage-controlled oscillating unit is provided, where the voltage-controlled oscillating unit generates a second oscillating signal according to the feedback injection signal. A frequency mixing unit is provided, where the frequency mixing unit mixes the first oscillating signal and the second oscillating signal to generate an output signal and the feedback injection signal.

As described above, in a frequency synthesizer provided by the present invention, a frequency mixing unit coupled to a phase-locked loop unit and a voltage-controlled oscillating unit is adopted, where the frequency mixing unit mixes an output signal of the phase-locked loop unit and an output signal of the voltage-controlled oscillating unit. Additionally, in the frequency synthesizer provided by the present invention, the mixed-frequency signal generated by the frequency mixing unit is further injected to the voltage-controlled oscillating unit to lock the frequency of the voltage-controlled oscillating unit, so as to reduce phase noises in the high-frequency output of the frequency mixing unit. Thereby, in the present invention, the applicable bandwidth of the frequency synthesizer is broadened, the hardware circuit design of the frequency synthesizer is simplified, and accordingly the power consumption and manufacturing cost of the frequency synthesizer are reduced.

These and other exemplary embodiments, features, aspects, and advantages of the invention will be described and become more apparent from the detailed description of exemplary embodiments when read in conjunction with accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
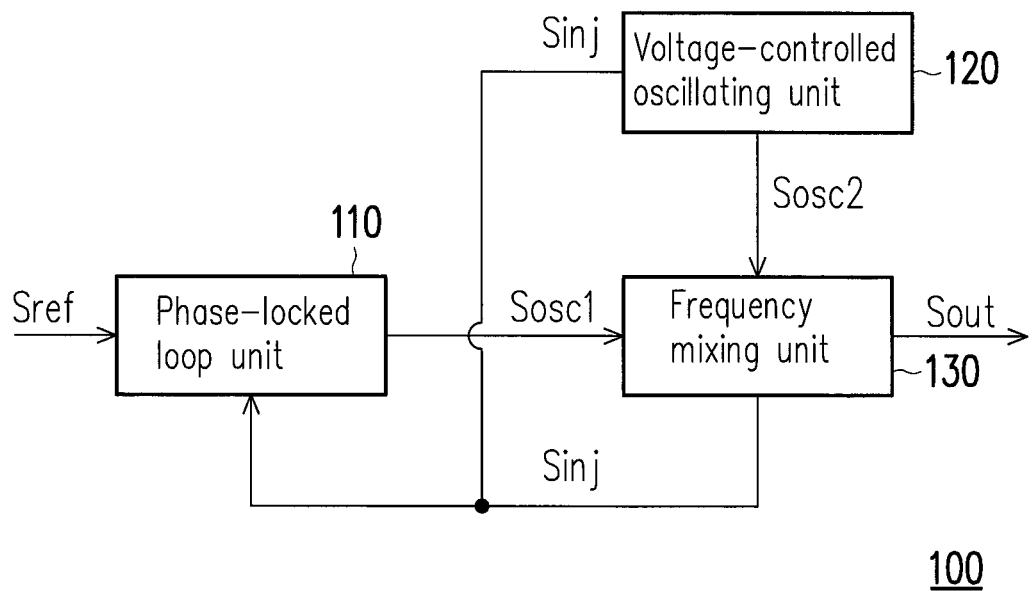
FIG. 1 is a diagram of a frequency synthesizer according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

The present invention provides a wideband frequency synthesizer based on phase-locked loop, in which a voltage-controlled oscillator and a frequency mixer are integrated to broaden the operating bandwidth of the frequency synthesizer. In addition, besides feeding back a mixed-frequency signal generated by the frequency mixer to a phase-locked loop unit to lock the output of the voltage-controlled oscillator in the phase-locked loop unit, the mixed-frequency signal generated by the frequency mixer is further injected to another voltage-controlled oscillator to lock the oscillating signal output by this voltage-controlled oscillator, so that the two oscillators in the frequency synthesizer can self-stabilize. Thereby, the frequency synthesizer provided by the present invention can synthesize high frequencies and become a frequency synthesizer with a broad operating bandwidth. Below, embodiments of the present invention will be described in detail with reference to accompanying drawings.

FIG. 1 is a diagram of a frequency synthesizer according to an embodiment of the present invention. The frequency synthesizer 100 includes a phase-locked loop unit 110, a voltage-controlled oscillating unit 120, and a frequency mixing unit 130. The frequency mixing unit 130 is coupled to the phase-locked loop unit 110 and the voltage-controlled oscillating unit 120. The phase-locked loop unit 110 receives a reference signal Sref and a feedback injection signal Sinj and generates a first oscillating signal Sosc1 according to the reference signal Sref and the feedback injection signal Sinj. To be specific, the phase-locked loop unit 110 is a negative feedback system. In the present embodiment, the phase-locked loop unit 110 maintains a constant relationship between the phase of the first oscillating signal Sosc1 and the phase of the reference signal Sref by using the feedback injection signal Sinj, and the frequency of the first oscillating signal Sosc1 also has a corresponding relationship due to some internal elements of the phase-locked loop unit 110.

The voltage-controlled oscillating unit 120 receives the feedback injection signal Sinj and generates a second oscillating signal Sosc2 according to the feedback injection signal Sinj. To be specific, the voltage-controlled oscillating unit 120 in the present embodiment has a voltage-controlled oscillator for generating the second oscillating signal Sosc2, and the voltage-controlled oscillating unit 120 receives an external injection signal to lock the second oscillating signal Sosc2 generated by the voltage-controlled oscillator. As mentioned above, in the present embodiment, the voltage-controlled oscillating unit 120 locks the output frequency of the second oscillating signal Sosc2 by using the feedback injection signal Sinj.

The frequency mixing unit 130 receives the first oscillating signal Sosc1 and the second oscillating signal Sosc2 and generates the feedback injection signal Sinj and an output signal Sout. To be specific, the frequency mixing unit 130 in the present invention respectively receives the first oscillating signal Sosc1 and the second oscillating signal Sosc2 from the phase-locked loop unit 110 and the voltage-controlled oscillating unit 120 and mixes the first oscillating signal Sosc1 and the second oscillating signal Sosc2. The frequency mixing operation includes deducting the frequency of the second oscillating signal Sosc2 from the frequency of the first oscillating signal Sosc1 to generate a differential frequency signal and adding the frequency of the first oscillating signal Sosc1 to the frequency of the second oscillating signal Sosc2 to generate a sum frequency signal. In the present embodiment, the feedback injection signal Sinj may be the differential frequency signal generated by the frequency mixing unit 130 or the sum frequency signal generated by the frequency mixing unit 130, which is not limited in the present invention. For example, if the feedback injection signal Sinj is the differential frequency signal generated by the frequency mixing unit 130, the frequency of the first oscillating signal Sosc1 is f1, and the frequency of the second oscillating signal Sosc2 is f2, the frequency of the feedback injection signal Sinj is then |f1−f2|. Besides, the output signal Sout output by the frequency synthesizer 100 is the sum frequency signal or the differential frequency signal generated by the frequency mixing unit 130, which is not limited in the present invention.

It should be noted that in the present invention, the feedback injection signal Sinj generated by the frequency mixing unit 130 is sent back to the phase-locked loop unit 110 and injected to the voltage-controlled oscillating unit 120, so that both the voltage-controlled oscillator in the phase-locked loop unit 110 and the voltage-controlled oscillator in the voltage-controlled oscillating unit 120 can self-stabilize. To be specific, the frequency mixing unit 130 can generate stable sum frequency signal and differential frequency signal according to the first oscillating signal Sosc1 and the second oscillating signal Sosc2. Accordingly, the frequency synthesizer in the present invention can stably control two oscillators through a single phase-locked loop circuit and a feedback injection mechanism, so that the problem of unstable sum frequency signal produced when high frequencies are mixed is resolved, and the operating bandwidth of the frequency synthesizer is broadened. Moreover, if the feedback injection signal Sinj is the differential frequency signal, since the differential frequency signal has a lower frequency, compared with using a signal phase lock loop unit directly lock sum frequency signal, the frequency locking time of the phase-locked loop unit is shortened by locking differential frequency and produce stable sum frequency. Namely, in the present invention, a stable sum frequency signal can be achieved, so as to greatly broaden the operating bandwidth, by simply adopting an oscillating unit and a frequency mixing unit.

Figure 2:
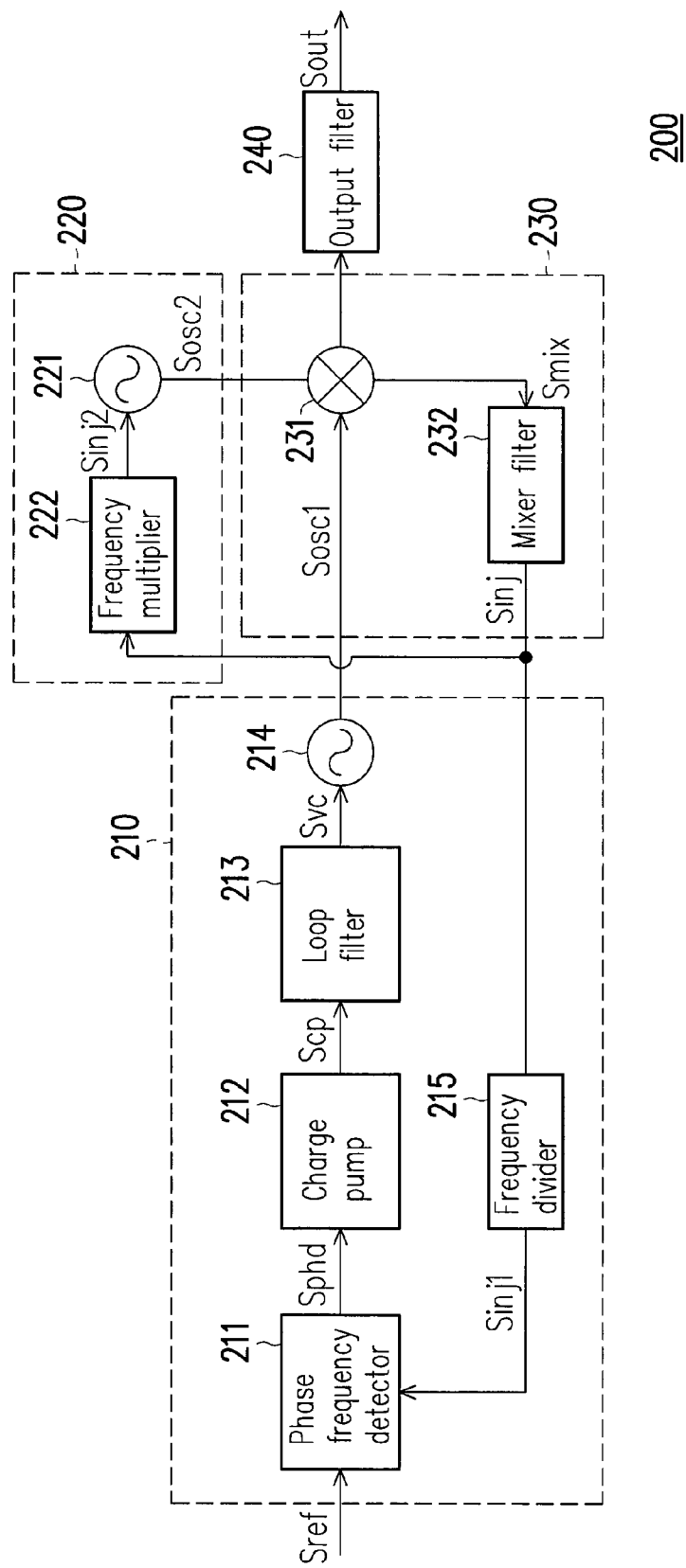
FIG. 2 is a diagram of a frequency synthesizer according to another embodiment of the present invention.

FIG. 2 is a diagram of a frequency synthesizer according to another embodiment of the present invention. Referring to FIG. 2, the frequency synthesizer 200 includes a phase-locked loop unit 210, a voltage-controlled oscillating unit 220, and a frequency mixing unit 230. The couplings between aforementioned elements and the functions of these elements are the same as or similar to those of the phase-locked loop unit 110, the voltage-controlled oscillating unit 120, and the frequency mixing unit 130 in foregoing embodiment and will not be described herein. Unlike that in the embodiment described above, the frequency synthesizer 200 in the present embodiment further includes an output filter 240. The output filter 240 is coupled to the frequency mixing unit 230. The output filter 240 high-pass or low-pass filters the output signal Sout of the frequency synthesizer 200 according to the actual application situation to filter out noises and generate a purer output signal Sout. In the present embodiment, the phase-locked loop unit 210, the voltage-controlled oscillating unit 220, and the frequency mixing unit 230 will be described in more detail.

The phase-locked loop unit 210 includes a phase frequency detector 211, a charge pump 212, a loop filter 213, a first voltage-controlled oscillator 214, and a frequency divider 215. The phase frequency detector 211 receives a reference signal Sref and a frequency-division signal Sinj1 and generates a phase difference signal Sphd according to the reference signal Sref and the frequency-division signal Sinj1. In short, when the phase frequency detector 211 receives the reference signal Sref and the frequency-division signal Sinj1, the phase frequency detector 211 compares frequency phases of the reference signal Sref and the frequency-division signal Sinj1 and generates the phase difference signal Sphd according to the phase difference between the reference signal Sref and the frequency-division signal Sinj1.

The charge pump 212 is coupled to the phase frequency detector 211. The charge pump 212 receives the phase difference signal Sphd and generates a charging signal Scp according to the phase difference signal Sphd. When the charge pump 212 receives the phase difference signal Sphd, it generates the corresponding charging signal Scp. For example, the charge pump 212 generates a corresponding charge pump current according to the phase difference signal Sphd or generates a corresponding charging voltage based on the phase difference signal Sphd, which is not limited in the present invention. In addition, the loop filter 213 is coupled to the charge pump 212. The loop filter 213 receives the charging signal Scp and generates a control signal Svc according to the charging signal Scp. Generally speaking, the loop filter 213 is a low-pass filter, and which is configured to filter off noises in the charging signal Scp to generate an optimal control signal Svc.

The first voltage-controlled oscillator 214 is coupled to the loop filter 213. The first voltage-controlled oscillator 214 receives the control signal Svc and generates a first oscillating signal Sosc1 according to the control signal Svc. Namely, the oscillation frequency of the first oscillating signal Sosc1 varies with the control signal Svc. The frequency divider 215 is coupled to the frequency mixing unit 230. The frequency divider 215 receives the feedback injection signal Sinj generated by the frequency mixing unit 230 and performs frequency-division to the feedback injection signal Sinj to generate the frequency-division signal Sinj1. In the present embodiment, the frequency divider 215 is an integer frequency divider, and the divider provided by the frequency divider 215 is a positive integer. For example, in an application of the present invention, the dividing factor provided by the frequency divider 215 is 16. In this case, when the feedback injection signal Sinj is 2.4 GHz, the frequency-division signal Sinj1 is 150 MHz. However, the value of the divider is not limited in the present invention and can be determined according to the actual application requirement. The dividing factor of the frequency divider 215 may also be 1 (i.e., the frequency division operation is not implemented and the feedback injection signal Sinj is directly sent back to the phase frequency detector 211). It should be mentioned that in another embodiment of the present invention, the phase-locked loop unit 110 may also be a fractional phase-locked loop. In other words, the frequency divider 215 is not limited to an integer frequency divider, and a fractional phase-locked loop can further increase the frequency resolution.

Thereby, in the present embodiment, the phase-locked loop unit 210 receives the feedback injection signal Sinj from the frequency mixing unit 230 and performs frequency-division to the feedback injection signal Sinj to generate a frequency-division signal Sinj1. Then, the output frequency of the first voltage-controlled oscillator 214 is controlled by comparing the phase of the frequency-division signal Sinj1 and the phase of the reference signal Sref. It should be mentioned that if the feedback injection signal Sinj is a differential frequency signal generated by the frequency mixing unit 230, since the differential frequency signal is a low-frequency signal, the dividing factor of the frequency divider 215 also has a smaller value. Thus, the frequency divider 215 has a simple design and is easy to implement. Besides, a frequency divider with a small divider can further shorten the frequency-locked time of the phase-locked loop unit 210.

The voltage-controlled oscillating unit 220 includes a frequency multiplier 222 and a second voltage-controlled oscillator 221. The frequency multiplier 222 is coupled to the frequency mixing unit 230. The frequency multiplier 222 receives the feedback injection signal Sinj and performs frequency-multiplication to the feedback injection signal Sinj to generate a frequency-multiplication signal Sinj2. In the present embodiment, the frequency multiplier is an integer frequency multiplier. However, the present invention is not limited thereto. For example, the multiplier provided by the frequency multiplier 222 is 5. In this case, when the feedback injection signal Sinj is 200 MHz, the frequency-multiplication signal Sinj2 is then 1 GHz. However, the value of the multiplier is not limited in the present invention and can be determined according to the actual application requirement. The multiplier of the frequency multiplier 222 may also be 1 (i.e., the frequency multiplication operation is not implemented and the feedback injection signal Sinj is directly sent back to the second voltage-controlled oscillator 221). The second voltage-controlled oscillator 221 is coupled to the frequency multiplier 222. The second voltage-controlled oscillator 221 receives the frequency-multiplication signal Sinj2 and generates a second oscillating signal Sosc2 according to the frequency-multiplication signal Sinj2. Herein the frequency-multiplication signal Sinj2 is used for locking the second voltage-controlled oscillator 221 to reduce frequency disturbance in the second oscillating signal Sosc2 and stabilize the second oscillating signal Sosc2.

The frequency mixing unit 230 includes a frequency mixer 231 and a mixer filter 232. The frequency mixer 231 is coupled to the phase-locked loop unit 210 and the voltage-controlled oscillating unit 220. The frequency mixer 231 receives the first oscillating signal Sosc1 and the second oscillating signal Sosc2 and mixes the first oscillating signal Sosc1 and the second oscillating signal Sosc2 to generate a mixed-frequency signal Smix and the output signal Sout. In short, the frequency mixer 231 mixes signals of two different frequencies and achieves a frequency increase or decrease effect by outputting a sum frequency signal or a differential frequency signal. For example, the frequency mixer 231 can be implemented as a double-balanced passive switching mixer circuit. However, the present invention is not limited thereto.

It should be mentioned that as described in foregoing embodiments, the two voltage-controlled oscillators in a frequency synthesizer provided by the present invention can self-stabilize. Thereby, both the sum frequency signal and the differential frequency signal generated by the frequency mixer 231 are stable signals and have good phase noise performance. In the present embodiment, the mixed-frequency signal Smix and the output signal Sout are sum frequency signals and differential frequency signals, which can be determined according to the actual application requirement.

The mixer filter 232 is coupled to the frequency mixer 231. The mixer filter 232 receives the mixed-frequency signal Smix and generates the feedback injection signal Sinj according to the mixed-frequency signal Smix. By selecting different external filter (for example, the mixer filter 232 in the present embodiment), the frequencies of mixed-frequency increase and decrease of the two voltage-controlled oscillators 214 and 221 in the frequency synthesizer 200 can be locked, so that a broad operating bandwidth can be achieved.

As described above, the mixed-frequency signal Smix includes the sum frequency item and differential frequency item, and the mixer filter 232 in the present embodiment can be a low-pass filter which filters out sum frequency item to generate a purer feedback injection signal Sinj for frequency divider 215 and frequency multiplier 222. The mixer filter 232 acts as a low pass filter for extracting the differential frequency. The disposition and configuration of the mixer filter 232 are not limited in the present invention, and which can be done according to the actual requirement even as an omission to simplify. As described above, the frequency synthesizer 200 in the present embodiment generates the feedback injection signal Sinj through the frequency mixer 231. Besides, the feedback injection signal Sinj is injected to the voltage-controlled oscillator 221 to lock the second oscillating signal Sosc2. Accordingly, phase noises in the high-frequency sum frequency signal generated by the frequency mixer 231 are reduced, and accordingly the stability of the high-frequency signal output by the frequency synthesizer 200 is improved. In other words, in the frequency synthesizer 200, both a differential frequency signal and a sum frequency signal are obtained from the two voltage-controlled oscillators through a frequency synthesis technique, and then the synthesized signal is injected to another voltage-controlled oscillator and locked through a phase-locked loop and a feedback injection mechanism, so that a single control loop can be achieved and the two voltage-controlled oscillators can self-stabilize.

As described above, a frequency synthesis method of a frequency synthesizer includes following steps. First, a phase-locked loop unit is provided, where the phase-locked loop unit generates a first oscillating signal according to a reference signal and a feedback injection signal (step S301). Then, a voltage-controlled oscillating unit is provided, where the voltage-controlled oscillating unit generates a second oscillating signal according to the feedback injection signal (step S302). After that, a frequency mixing unit is provided, where the frequency mixing unit mixes the first oscillating signal and the second oscillating signal to generate an output signal and the feedback injection signal (step S303). Thereby, in the frequency synthesis method provided by the present invention, the operating bandwidth of the frequency synthesizer can be greatly broadened by simply disposing a voltage-controlled oscillator and a frequency mixer in the phase-locked loop structure.

Generally, in the present invention, the oscillating signals generated by two voltage-controlled oscillators are mixed by a frequency mixer to generate a differential frequency signal and a sum frequency signal of the two oscillating signals. Then, a voltage-controlled oscillator in the phase-locked loop is locked by using the differential frequency signal, and another voltage-controlled oscillator is locked through feedback injection of the differential frequency signal or the multiplication-signal of the differential frequency signal, so that the two voltage-controlled oscillators in the frequency synthesizer provided by the present invention can stabilize, and both the differential frequency signal and the sum frequency signal have good phase noise performance. Accordingly, the sum high-frequency output of the frequency mixer is stabilized, and the operating bandwidth of the frequency synthesizer is broadened. Additionally, in the present invention, due to the adoption of the differential frequency signal generated by a frequency mixing unit, the operating frequency of a frequency divider is lowered through a low-frequency loop control and feedback injection, so that the frequency divider can overcome many obstacles in high-frequency circuit design. Thereby, the circuit structure of the frequency synthesizer is simplified, the power consumption and manufacturing cost thereof are reduced, and the frequency locking time thereof is shortened.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A frequency synthesizer, comprising:
   a phase-locked loop (PLL) unit, receiving a reference signal and a feedback injection signal, and generating a first oscillating signal according to the reference signal and the feedback injection signal;
   a voltage-controlled oscillating unit, receiving the feedback injection signal, and generating a second oscillating signal according to the feedback injection signal; and
   a frequency mixing unit, coupled to the phase-locked loop unit and the voltage-controlled oscillating unit, receiving the first oscillating signal and the second oscillating signal, and mixing the first oscillating signal and the second oscillating signal to generate the feedback injection signal and an output signal.

2. The frequency synthesizer according to claim 1, wherein the feedback injection signal is a differential frequency signal generated by the frequency mixing unit according to the first oscillating signal and the second oscillating signal.

3. The frequency synthesizer according to claim 1, wherein the phase-locked loop unit comprises:
   a frequency divider, coupled to the frequency mixing unit, receiving the feedback injection signal, and performing frequency-division to the feedback injection signal to generate a frequency-division signal;
   a phase frequency detector, coupled to the frequency divider, receiving the reference signal and the frequency-division signal, and generating a phase difference signal according to the reference signal and the frequency-division signal;
   a charge pump, coupled to the phase frequency detector, receiving the phase difference signal, and generating a charging signal according to the phase difference signal;
   a loop filter, coupled to the charge pump, receiving the charging signal, and generating a control signal according to the charging signal; and
   a first voltage-controlled oscillator, coupled to the loop filter, receiving the control signal, and generating the first oscillating signal according to the control signal.

4. The frequency synthesizer according to claim 3, wherein the frequency divider is an integer frequency divider.

5. The frequency synthesizer according to claim 1, wherein the voltage-controlled oscillating unit comprises:
   a frequency multiplier, coupled to the frequency mixing unit, receiving the feedback injection signal, and performing frequency-multiplication to the feedback injection signal to generate a frequency-multiplication signal; and
   a second voltage-controlled oscillator, coupled to the frequency multiplier, receiving the frequency-multiplication signal, and generating the second oscillating signal according to the frequency-multiplication signal.

6. The frequency synthesizer according to claim 5, wherein the frequency multiplier is an integer frequency multiplier.

7. The frequency synthesizer according to claim 1, wherein the frequency mixing unit comprises:
   a frequency mixer, coupled to the phase-locked loop unit and the voltage-controlled oscillating unit, receiving the first oscillating signal and the second oscillating signal, and mixing the first oscillating signal and the second oscillating signal to generate a mixed-frequency signal and the output signal; and
   a mixer filter, coupled to the frequency mixer, receiving the mixed-frequency signal, and generating the feedback injection signal according to the mixed-frequency signal.

8. The frequency synthesizer according to claim 7, wherein the frequency synthesizer further comprises:
   an output filter, coupled to the frequency mixer, receiving the output signal, and low-pass filtering or high-pass filtering the output signal.

9. A frequency synthesis method of a frequency synthesizer, comprising:
   providing a phase-locked loop unit, wherein the phase-locked loop unit generates a first oscillating signal according to a reference signal and a feedback injection signal;
   providing a voltage-controlled oscillating unit, wherein the voltage-controlled oscillating unit generates a second oscillating signal according to the feedback injection signal; and
   providing a frequency mixing unit, wherein the frequency mixing unit mixes the first oscillating signal and the second oscillating signal to generate an output signal and the feedback injection signal.

* * * * *